United States Patent
Das et al.

[11] Patent Number: 5,978,409
[45] Date of Patent: Nov. 2, 1999

[54] LINE NARROWING APPARATUS WITH HIGH TRANSPARENCY PRISM BEAM EXPANDER

[75] Inventors: Palash P. Das, Vista; Alexander I. Ershov; Richard G. Morton, both of San Diego, all of Calif.

[73] Assignee: Cymer, Inc., San Diego, Calif.

[21] Appl. No.: 09/162,341

[22] Filed: Sep. 28, 1998

[51] Int. Cl.⁶ .................................................. H01S 3/08
[52] U.S. Cl. ........................... 372/100; 372/57; 372/98; 372/102; 372/107
[58] Field of Search .............................. 372/57, 102, 107, 372/108, 98, 20, 100

[56] References Cited

U.S. PATENT DOCUMENTS

| | | | |
|---|---|---|---|
| 4,972,429 | 11/1990 | Herbst | 372/100 |
| 5,177,750 | 1/1993 | Zorabedian | 372/107 |
| 5,559,816 | 9/1996 | Basting | 372/102 |
| 5,761,236 | 6/1998 | Kleinschmidt et al. | 372/20 |
| 5,802,094 | 9/1998 | Wakabayashi et al. | 372/102 |

*Primary Examiner*—Leon Scott, Jr.
*Attorney, Agent, or Firm*—John R. Ross, Esq.

[57] ABSTRACT

A grating based line-narrowing apparatus having a prism beam expander with at least four prisms. Each prism is positioned at an incidence angle between 67 and 71 degrees. A single layer coating of high refractive index, robust material, such as $Al_2O_3$, is applied to the hypotenuse face of each prism, providing an efficient, anti-reflection coating. In a preferred embodiment the incident angle of the four prisms are each at about 68.2 degrees. The laser of the preferred embodiment has similar line narrowing efficiency and bandwidth as that for a laser with a 3 prism, ideal multi-layer anti-reflection coated beam expander. The primary benefit of the new four prism arrangement is that the prism coatings should be much less expensive and have greatly increased durability. Applicants have tested the new prisms for 30 million, 10 mJ pulses in air with no noticeable degradation. No present day dielectric multi-layer stack coating could survive such exposure.

14 Claims, 6 Drawing Sheets

LINE NARROWING APPARATUS WITH HIGH TRANSPARENCY PRISM BEAM EXPANDER

This invention relates to excimer lasers and in particular to narrow band excimer lasers.

BACKGROUND OF THE INVENTION

Excimer lasers are currently used for integrated circuit lithography as a light source. They illuminate a mask whose image is then projected on a silicon wafer. Due to the limitations set by optical diffraction, the smaller the desired printed features, the shorter the wavelength of the light must be.

Currently, a KrF excimer laser working at 248 nm is in worldwide use in chip manufacturing with a features size as small as about $0.25\mu$. ArF excimer lasers are entering the market as a light source for even smaller feature microlithography, as small as about $0.15\mu$.

Due to the very limited number of materials which are transparent to 193 nm light, the imaging lens for 193 nm exposure tools will not have good chromatic correction. Therefore, it is important to provide a laser with a very narrow spectrum of less than 1.0 pm. The spectrum of the free-running ArF laser is about 200 pm. Therefore, significant spectral line narrowing should be done in order to be able to use the laser in refractive optical microlithography.

Techniques for decreasing the bandwidth of laser output beams are well known. Several such techniques used on excimer lasers are discussed by John F. Reintjes on pages 44–50 in *Laser Handbook*, Vol. 5, North-Holland Physics Publishing, Elsevier Science Publishers B.V. These techniques include the utilization of gratings including echelle gratings for wavelength selection. The use of beam expanding prisms ahead of the grating can increase the effectiveness of the grating.

A typical prior art ArF excimer laser is shown in FIG. 1. The resonant cavity of the excimer laser 2 is formed by an output coupler 4 (which can be a 30 percent partially reflecting mirror) and an echelle grating 16. A portion of the laser beam transmits through the output coupler and exits the laser as an output beam 18. The remaining part of the beam is reflected by the output coupler 4 back to the chamber 3 for amplification and narrow banding. Beam 20 (having a cross section of about 3 mm in horizontal direction and about 15 mm in the vertical direction) exits the rear of the laser chamber 3. This portion of the beam is expanded in the horizontal direction by prisms 8, 10, and 12 and reflected by a mirror 14 onto the echelle grating 16. Grating 16 is arranged in Littrow configuration, so that a selected narrow band of wavelengths is reflected back off mirror 14 and back through prisms 12, 10, and 8 and into the chamber 3 for further amplification. Light at wavelengths outside the selected narrow band is angularly dispersed so that the out-of-band light is not reflected back into the laser chamber. The absolute values of the desired spectral wavelength range is selected by pivoting mirror 14. Total beam expansion of the prior art ArF excimer laser is about 20x. The beam has a horizontal polarization (p-polarization for the prisms). Typical ArF lasers operating in a pulse mode may have a cavity length of about 1 m and produce pulses having a duration of about 20 to 30 ns. Thus, photons within the resonance cavity will make, on the average, about 3 to 5 round trips within the cavity. On each round trip, about 70 percent of the beam exits at the output coupler and about 30 percent is sent back for further line narrowing. The beam is repeatedly line narrowed as it passes through the line-narrowing module.

The spectrum of excimer lasers used for lithography is generally specified in two different ways. One is the spectral width measured at half-maximum level (FWHM). The other spectral specification commonly used to characterize microlithography excimer lasers is referred to as the "95% integral". This is the spectral width of the portion of the pulse containing 95% of the total pulse energy. Typically, FWHM values of about 0.6 pm and 95% integral values of about 1.5 pm are required for 193 nm lithography.

The prior art ArF excimer laser referred to above is capable of meeting the above mentioned spectral requirements and it has been used in the prototype stages of ArF lithography development. However, there are still significant problems associated with the use of the prior art ArF laser in production scale lithography applications. One of the most significant problems is caused by loss of light reflected by the prisms surfaces.

The conventional way to reduce reflections from optical surfaces is to use various anti-reflection (AR) coatings. It is relatively easy to make an anti-reflection dielectric coating for light at normal incidence. Such a prior art coating would have alternating quarter-wave layers of high refractive index material and low-refractive index material, designed in such a way, that the light waves, reflected from these layers undergo destructive interference with each other, so that the total reflection is minimized. Currently, a number of suppliers offer anti-reflection coatings which have total losses due to reflection and absorption of less than 1%. For example, Acton Research Corporation (Acton, Mass.) offers such a coating.

Unfortunately, the 20x times magnification requirement using three prisms means that the light incidence angle on the hypotenuse of the prism needs to be about 74 degrees. It is very difficult to make an AR coating at 193 nm for such a large incidence angle. At this angle, the reflection reduction efficiency of the stack of quarter-wave layers is reduced dramatically, so that the required number of layers is substantially increased and the thickness and density tolerance on each layer is greatly tightened. In addition, the choice of materials with good transmission at such a short wavelength is greatly limited, and many of them are either hygroscopic or too soft. What is needed for a production scale ArF laser however, is a coating which has a reflection less than about 2.0% at 193 nm, absorption less than 0.5%, the ability to withstand several billion pulses at 193 nm with a pulse energy density of up to 20 $mJ/cm^2$, and good compatability with industrial environments. It is extremely difficult and expensive to make such a coating, which means it is not currently available for large scale production at an acceptable cost.

Therefore, the only alternative currently available—is not to use any hypotenuse coatings at all. The result is substantial losses due to Fresnel reflections off of the prism hypotenuse surfaces. In this case, the reflectivity of each surface is about 9% for $CaF_2$ prisms and about 8.6% for fused silica prisms. Considering, that the light goes through each prism twice per round trip, we have total of 6 reflections at hypotenuse surfaces with the total losses from these reflections equal to 43.2% for $CaF_2$ and 41.7% for fused silica. The impact of these losses is a significant reduction in laser efficiency. For example, the laser, which has an output of 5W at 1 kHz when using all AR coated prisms will produce about 3W when no hypotenuse AR coating is used. Such a reduction of efficiency means reduced product throughput, reduced operating lifetime of the laser and increased cost of ownership.

Therefore, what is needed, is an alternative technique, which permits the required line narrowing without substantially reducing the laser efficiency, and which is suitable for large-scale production requirements.

SUMMARY OF THE INVENTION

The present invention provides a grating based line-narrowing apparatus having a prism beam expander with at least four prisms. Each prism is positioned at an incidence angle between 67 and 71 degrees. A single layer coating of a high refractive index, robust material, such as $Al_2O_3$, is applied to the hypotenuse face of each prism, providing an efficient, anti-reflection coating. In a preferred embodiment the incident angle of the four prisms are each at about 68.2 degrees. The laser of the preferred embodiment has similar line narrowing efficiency and bandwidth as that for a laser with a 3 prism, ideal multi-layer anti-reflection coated beam expander. The primary benefit of the new four prism arrangement is that the prism coatings should be much less expensive and have greatly increased durability. Applicants have tested the new prisms for 30 million, 10 mJ pulses in air with no noticeable degradation. No present day dielectric multi-layer stack coating could survive such exposure.

DETAILED DESCRIPTION OF PREFERRED EMBODIMENTS

Figure 1:
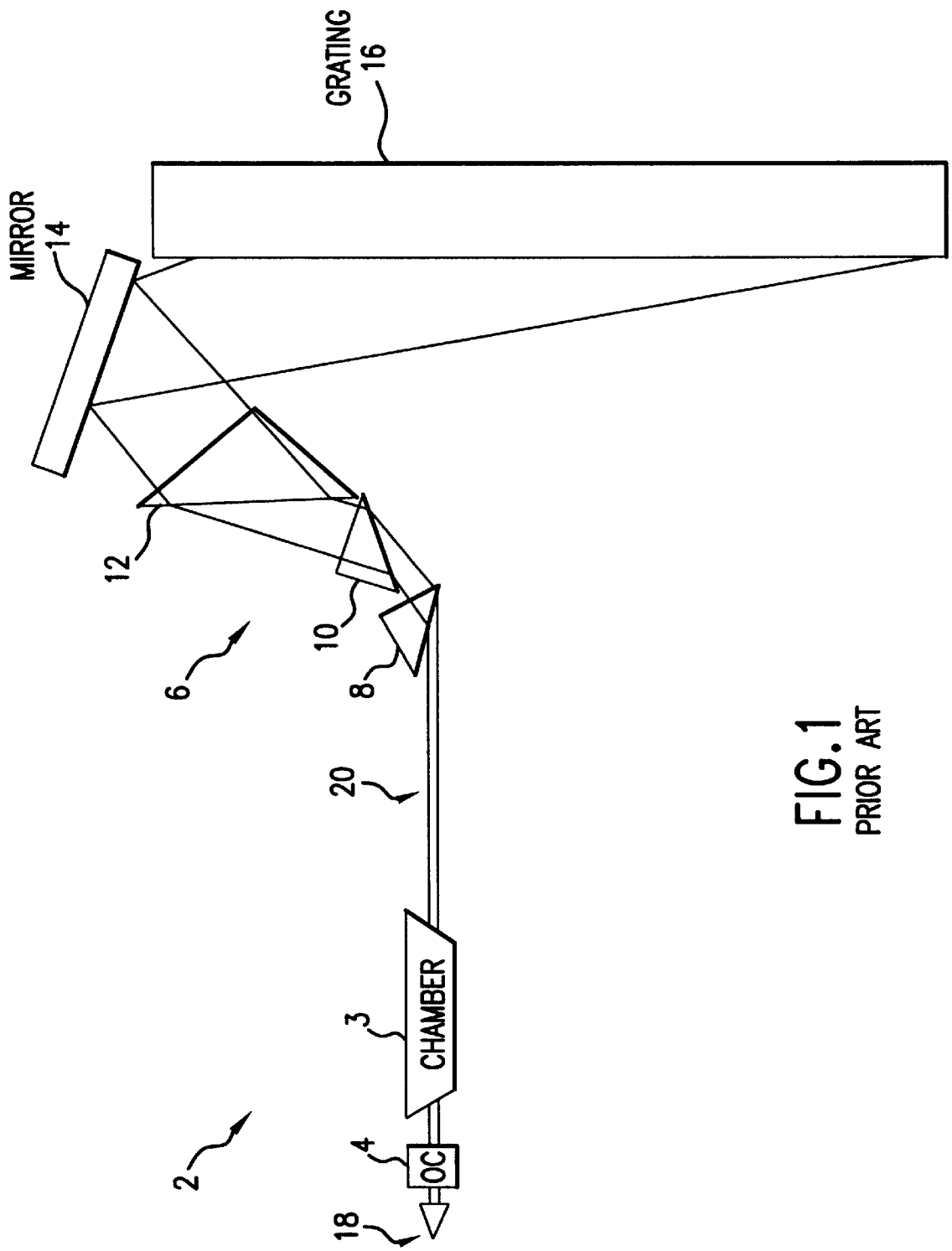
FIG. 1 depicts a prior art ArF line-narrowed laser.
Figure 2:
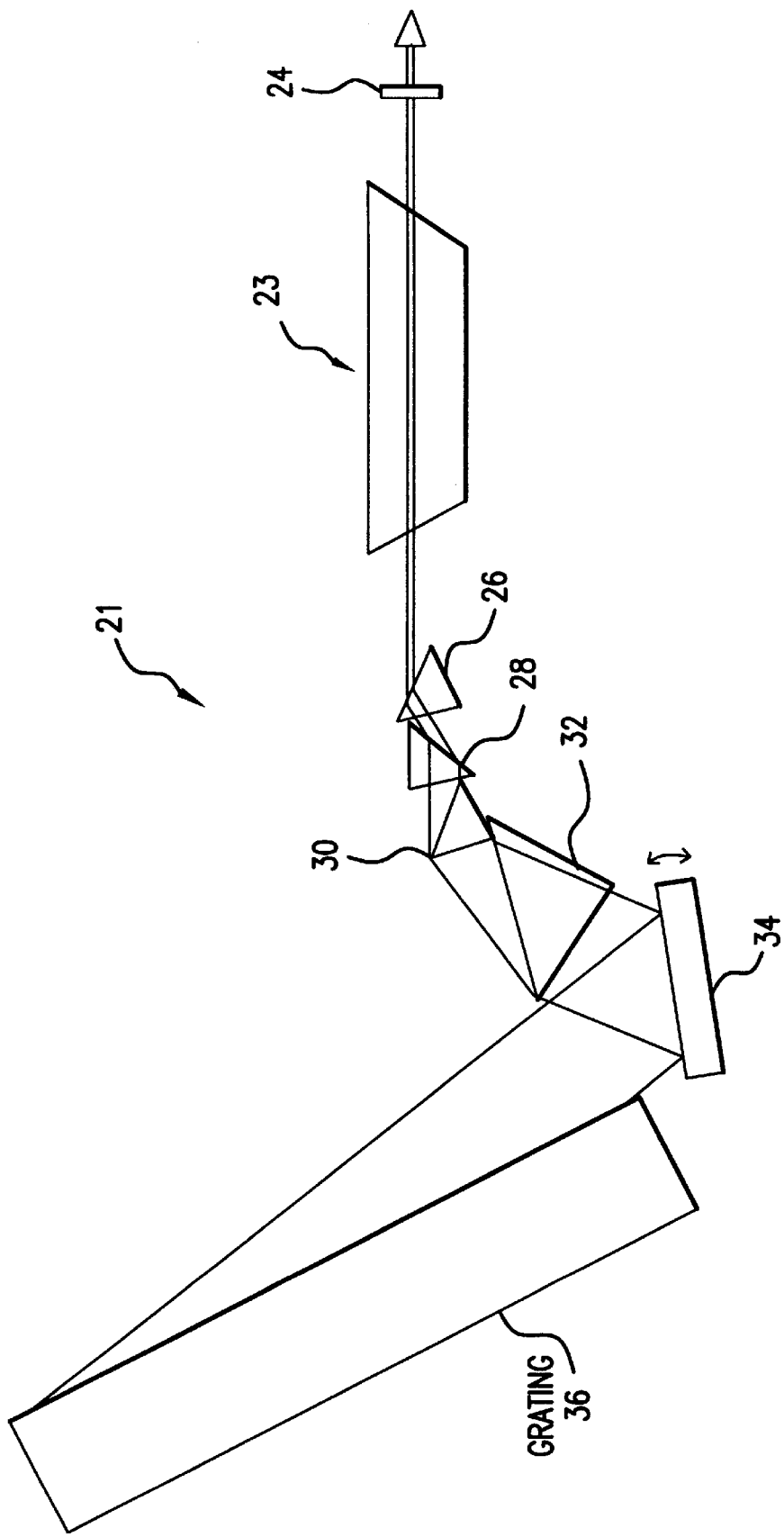
FIG. 2 depicts an ArF line narrowed laser of the present invention.
Figure 3:
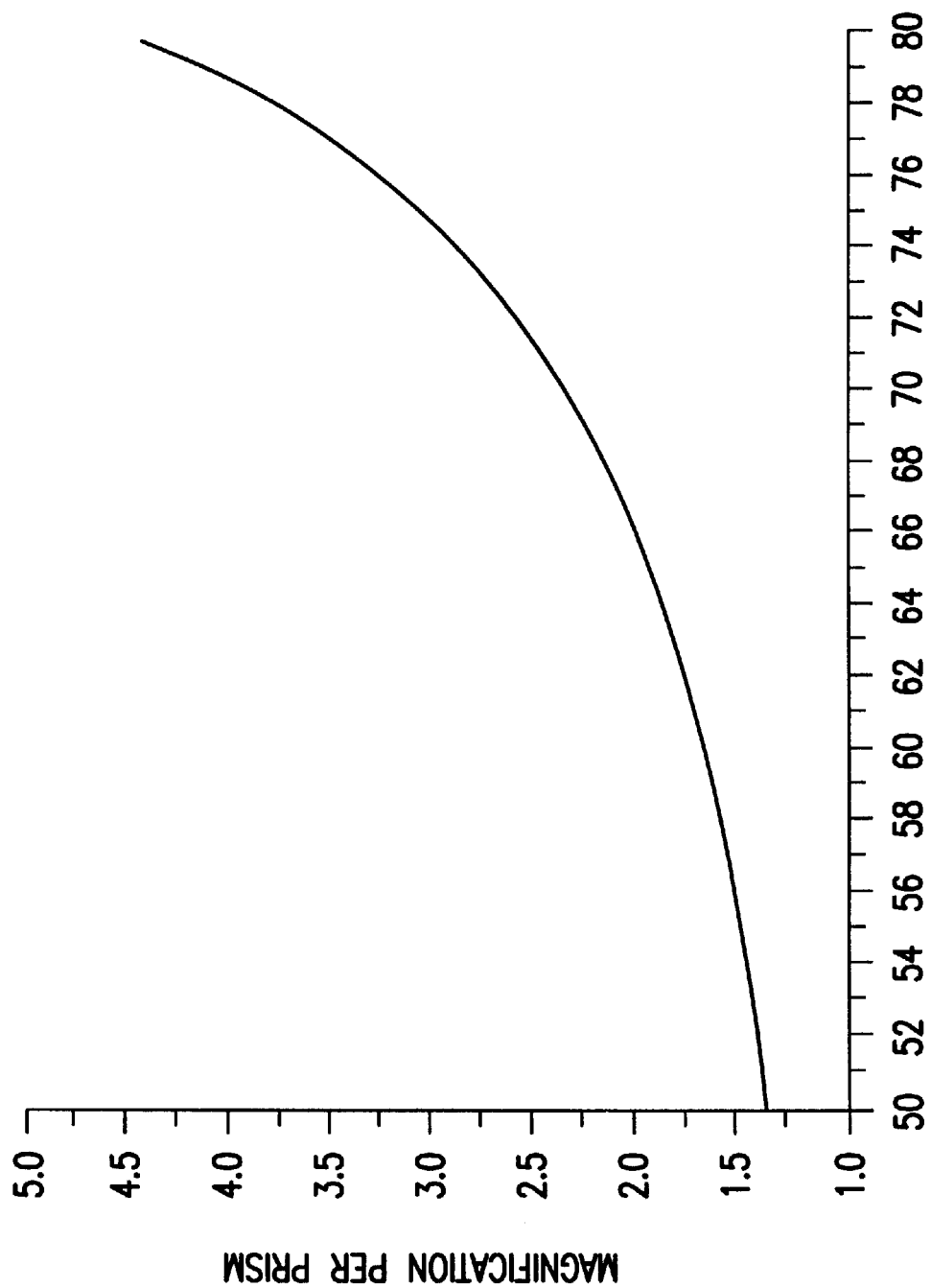
FIG. 3 shows magnification per prism as a function of hypotenuse incidence angle.

FIG. 2 shows an ArF laser of the present invention. The resonant cavity of the laser 21 is created by an output coupler 24 and a diffraction grating 36 similar to the prior art ArF laser. The beam is expanded with a prism beam expander. The beam expander consists of four prisms: 26, 28, 30, 32 and provides for a similar 20× expansion of the beam. The prisms are made out of $CaF_2$. Mirror 34 is used to select the narrow band for laser operation. A major difference with the prior art laser is, that the laser of the present invention uses four prisms instead of three. The increase of the number of prisms allows us to reduce the required magnification on each prism from about 2.71 for a three prism design to about 2.11 in the four prism design. FIG. 3 shows the magnification for a single prism as a function of incidence angle at the hypotenuse of a rectangular prism. One can see that this reduction of the magnification per prism allows us to reduce the incidence angle on the prism hypotenuse from about 73.5 degrees to about 68.2 degrees. That might seem like a small change, but it is very important. It allows us to use a single layer of high refractive index material as an anti-reflection coating. This contradicts common practice which is to use a low refractive index material for single layer anti-reflection coatings. According to the common practice (see, for example, Jurgen R. Meyer-Arendt, Introduction to Classical and Modern Optics, Prentice Hall, New Jersey, 1989), this material should have a refractive index $$n_{coating} = \sqrt{n_{glass}},$$

where $n_{coating}$ is the refractive index of coating material, and $n_{glass}$ is the refractive index of the prism.

Figure 4:
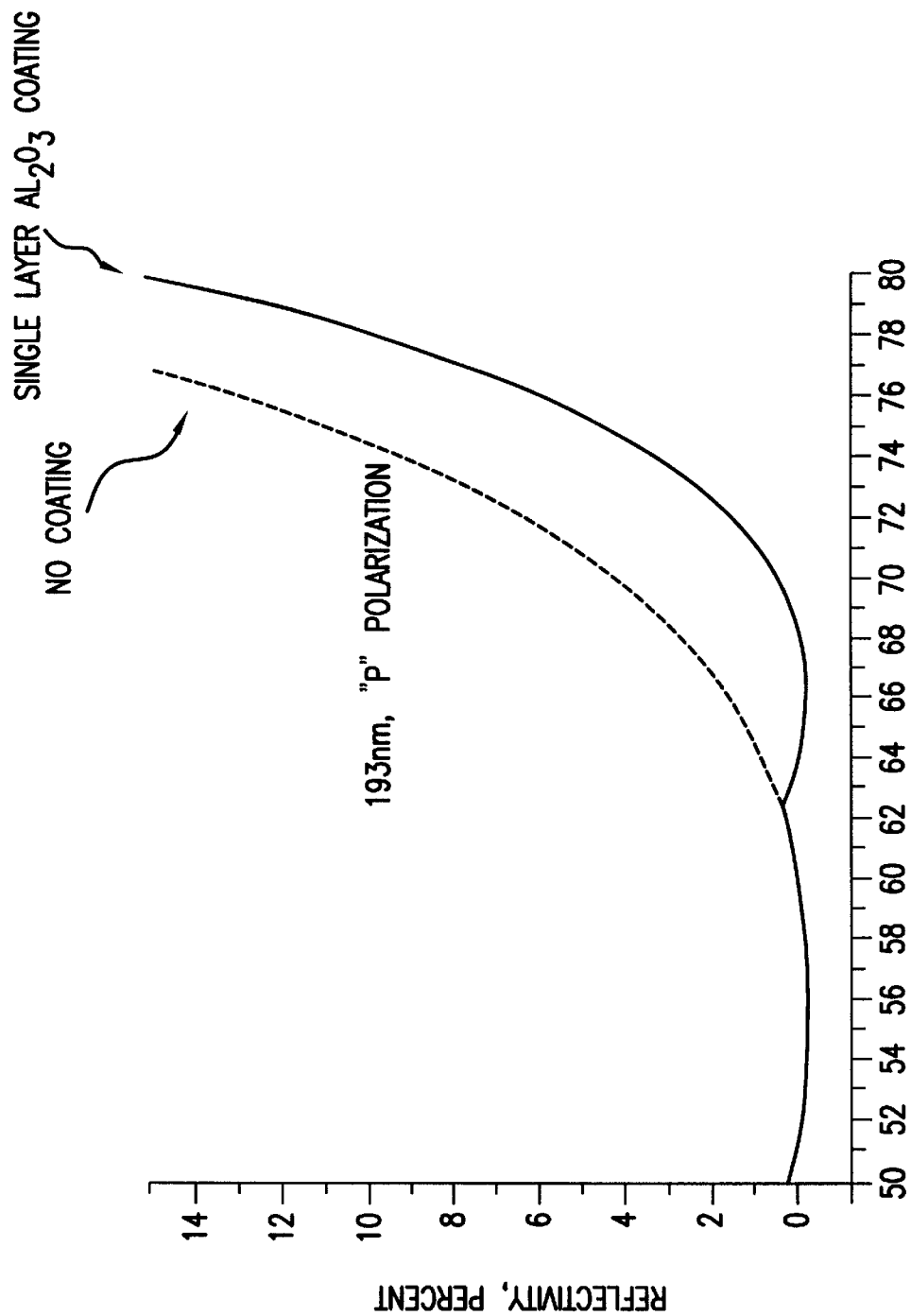
FIG. 4 shows the reflection from a calcium fluoride surface as a function of angle of incidence without (dotted curve) and with (solid curve) the single layer $Al_2O_3$ coating.

This approach works well, however, only for small angles of incidence. At the high angles of incidence, particularly higher than the Brewster angle (which is about 57 degrees for $CaF_2$ at 193 nm), the situation is quite the opposite, that is the refractive index of the thin film material should be higher than that of substrate. With a $CaF_2$ prism, one such coating material can be aluminum oxide $Al_2O_3$. A thin film of this material can be deposited by well known prior art techniques, such as vacuum evaporation or sputtering. It has a refractive index of about 1.9 at 193 nm and low absorption. It is mechanically very hard and resistant to most environments. It is not hygroscopic. This combination of properties makes it the best candidate for an antireflection coating. FIG. 4 shows the theoretical minimum reflectivity, which can be achieved with a single layer of $Al_2O_3$ on $CaF_2$ for p-polarized light as compared to the reflectivity of an uncoated $CaF_2$ surface. One can see, that a single layer coating reduces reflectivity at a 68.2 degree angle of incidence from about 2.9% for an uncoated $CaF_2$ prism to about 0.15%, which is a very good result. This would be difficult to match using multilayer dialectric coatings. Total double pass losses due to reflection on the hypotenuses are reduced from about 21% for uncoated prisms to about 1.2% for single layer $Al_2O_3$ coated. This allows us to achieve a high efficiency and good line-narrowing as with a prior art ArF laser but with no use of expensive, fragile, high-incidence angle multi-layer anti-reflection coatings.

Figure 5:
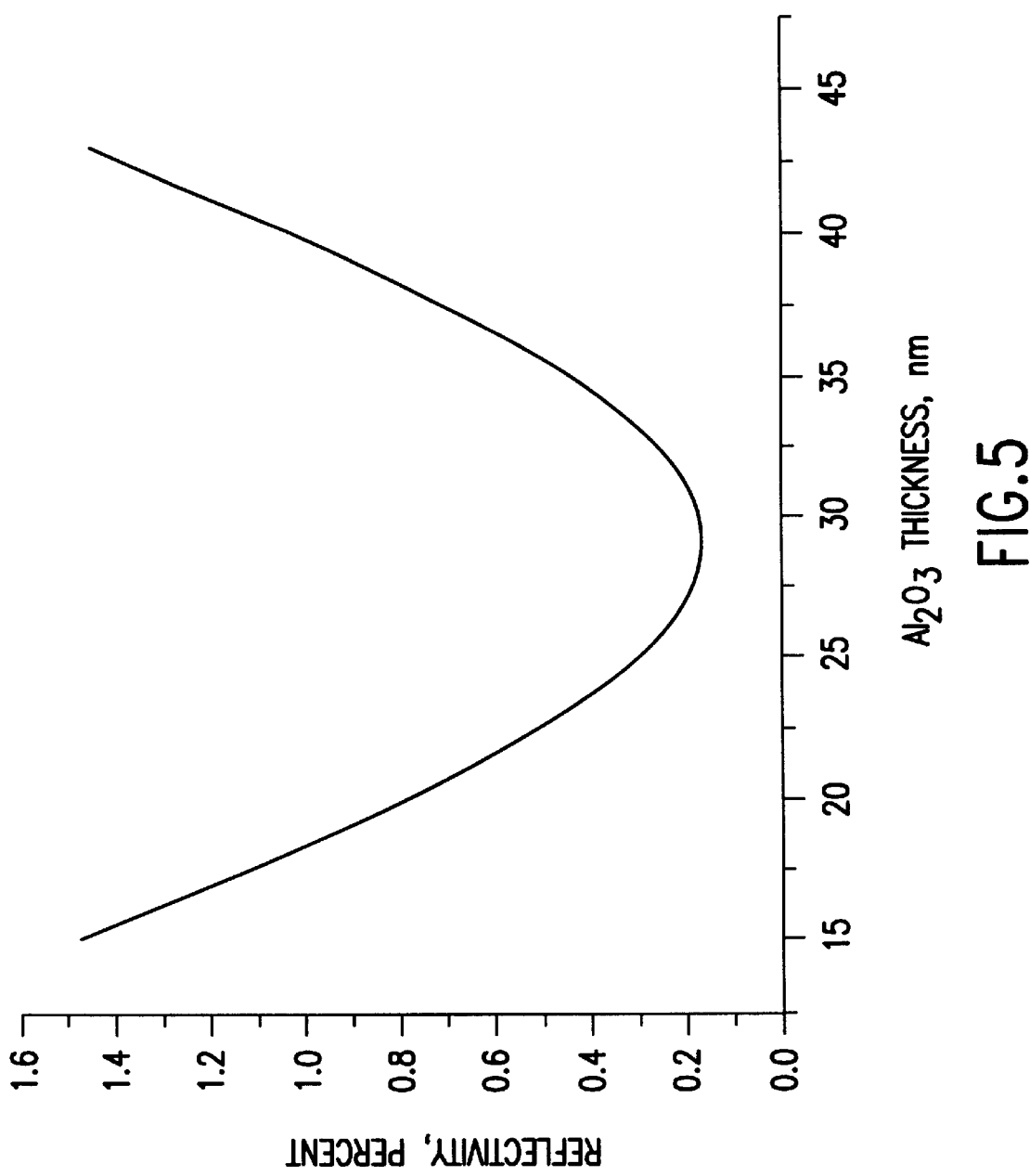
FIG. 5 shows the theoretical reflectivity of a $CaF_2$ surface with a single layer of $Al_2O_3$ at 68.2 degrees incidence angle as a function of the coating thickness for 193 nm p-polarized light.

FIG. 5 shows the reflectivity of a single layer of $Al_2O_3$ as a function of coating thickness for p-polarized light at 193 nm incident at an angle of 68.2 degrees. The minimum reflectivity is achieved at a thickness of 29 nm. A reflectivity less than 0.5% is achieved within the range of about 23 nm to about 35 nm. This is a very wide range and it facilitates coating process control.

Figure 6:
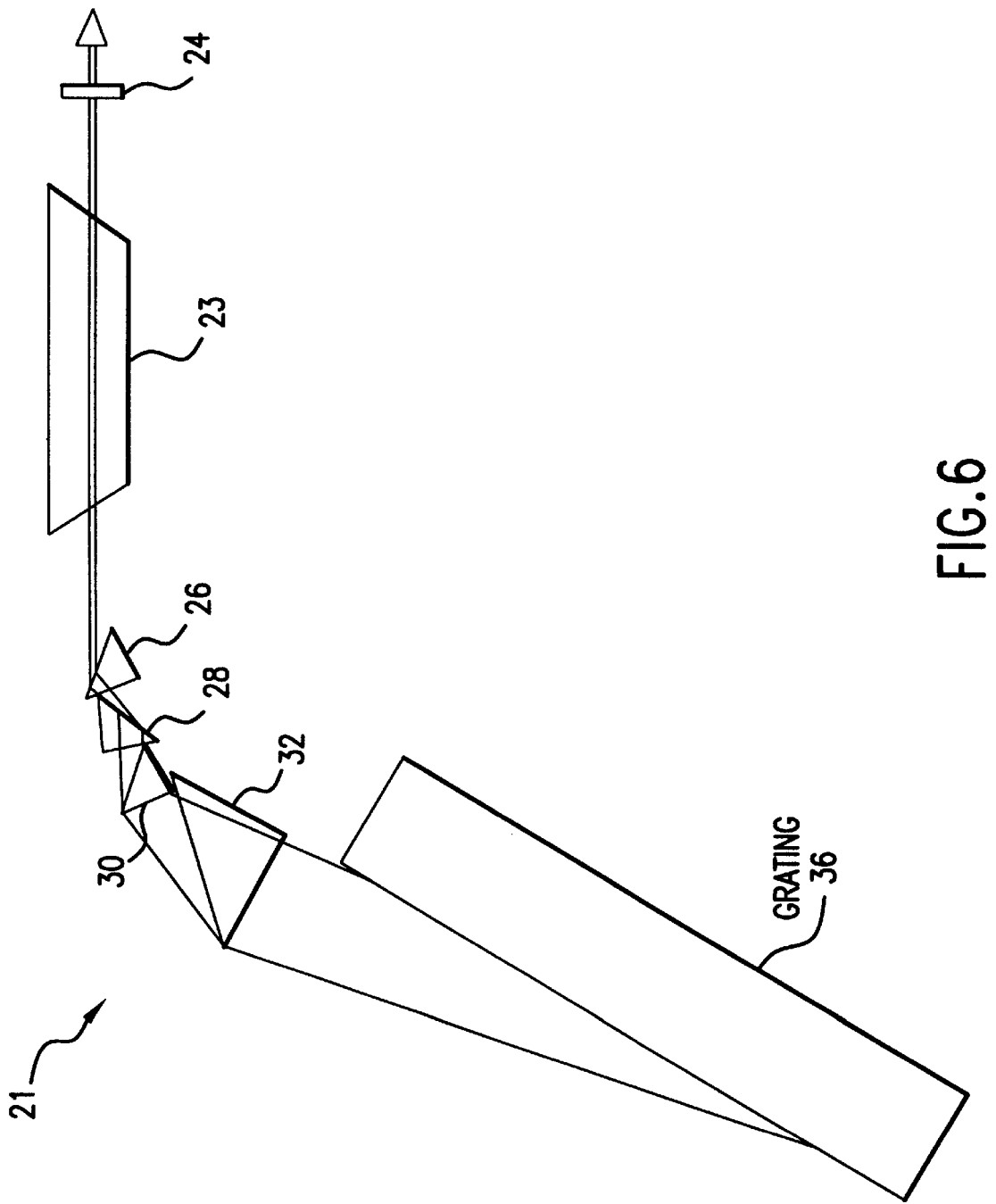
FIG. 6 shows a second embodiment of the ArF line-narrowed laser of the present invention.

A second embodiment of the present invention is shown in FIG. 6. In this embodiment, the resonant cavity of the laser 21 is created by an output coupler 24 and a diffraction grating 36. The beam is expanded with a prism beam expander. The beam expander consists of four prisms: 26, 28, 30, 32 and provides a 20× expansion of the beam. The prisms are comprised of $CaF_2$. In this embodiment, the wavelength selection mirror 34 (see FIG. 2) of the first embodiment is not used. Instead, the narrow band is selected by pivoting the grating 36, thus the overall optical length of the laser is reduced, resulting in even further improvement of the laser operating efficiency. Other embodiments with right and left hand versions, and mirror image placement of the four prisms and grating are also, obviously, possible. An additional (5th) prism positioned at about 69 degrees would increase the beam expansion to about 42×.

The reader should note that the various modifications and adoptions could be made to the specific embodiments described above. Therefore, the scope of the invention is to be limited to the appended claims and their legal equivalents.

What is claimed is:

1. A line narrowing apparatus for line narrowing a laser comprising:

a) a grating, and b) a prism beam expander comprised of at least four $CaF_2$ prisms each prism having on at least one surface, defining a coated surface, a single-layer coating, said coating being comprised of a material having an index of refraction greater than the index of refraction of $CaF_2$, wherein said prisms are positioned such that a laser beam passing out of said chamber intersects the coated surface of each of said prisms at an entrance angle between 67 and 71 degrees to substantially reduce reflection losses in the beam expander, and said beam exiting said beam expander is expanded in an expansion direction by a factor of at least about 20; wherein said single layer coating also substantially reduces reflection losses in the beam expander as compared to uncoated prisms and provides substantially increased durability as compared to multilayer coatings.

2. A line narrowing technique as in claim 1 wherein said laser beam is expanded by about 20 times.

3. A line narrowing technique as in claim 1 wherein said single layer coating is a coating material having an index of refraction between 1.5 and 2.5.

4. A line narrowing technique as in claim 1 wherein said single layer coating is $Al_2O_3$.

5. A line narrowing technique as in claim 1 wherein said single layer coating is $GdF_3$.

6. A line narrowing technique as in claim 1 wherein said prism beam expander comprises four prisms.

7. A line narrowing technique as in claim 1 wherein said prism beam expander comprises more than four prisms each positioned at incidence angles of less than 68 degrees.

8. An argon-fluoride excimer laser comprising:

A) a laser chamber containing:
  1) two elongated electrodes,
  2) a laser gas mixture comprising argon, fluorine and a buffer gas,
  3) at least two windows permitting passage out of the chamber of laser beams, and B) a resonant cavity comprised of:
  1) an output coupler,
  2) a line narrowing module comprised of:
    a) a grating,
    b) a prism beam expander comprised of at least four $CaF_2$ prisms each prism having on at least one surface, defining a coated surface, a single-layer coating, said coating being comprised of a material having an index of refraction greater than the index of refraction of $CaF_2$, wherein said prisms are positioned such that a laser beam passing out of said chamber intersects the coated surface of each of said prisms at an entrance angle between 67 and 71 degrees to substantially reduce reflection losses in the beam expander, and said beam exiting said beam expander is expanded in an expansion direction by a factor of at least about 20; wherein said single layer coating also substantially reduces reflection losses in the beam expander as compared to uncoated prisms and provides substantially increased durability as compared to multilayer coatings.

9. A laser as in claim 8 wherein said laser beam is expanded by about 20 times.

10. A laser as in claim 8 wherein said single layer coating is a coating material having an index of refraction between 1.5 and 2.5.

11. A laser as in claim 8 wherein said single layer coating is $Al_2O_3$.

12. A laser as in claim 8 wherein said single layer coating is $GdF_3$.

13. A laser as in claim 8 wherein said prism beam expander comprises four prisms.

14. A laser as in claim 8 wherein said prism beam expander comprises more than four prisms each positioned at incidence angles of less than 68 degrees.

* * * * *